United States Patent
Kim

(10) Patent No.: US 10,020,428 B2
(45) Date of Patent: Jul. 10, 2018

(54) WHITE LIGHT EMITTING DEVICE HAVING HIGH COLOR RENDERING

(71) Applicant: GLBTECH CO., LTD., Gyeonggi-do (KR)

(72) Inventor: Han Do Kim, Gyeonggi-do (KR)

(73) Assignee: GLBTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 14/917,380

(22) PCT Filed: Aug. 18, 2014

(86) PCT No.: PCT/KR2014/007614
§ 371 (c)(1),
(2) Date: Mar. 8, 2016

(87) PCT Pub. No.: WO2015/050317
PCT Pub. Date: Apr. 9, 2015

(65) Prior Publication Data
US 2016/0218255 A1    Jul. 28, 2016

(30) Foreign Application Priority Data

Oct. 2, 2013  (KR) .................. 10-2013-0117971
Jun. 13, 2014 (KR) .................. 10-2014-0071997

(51) Int. Cl.
*H01L 33/50* (2010.01)
*C09K 11/08* (2006.01)
(Continued)

(52) U.S. Cl.
CPC ........... *H01L 33/504* (2013.01); *C09K 11/02* (2013.01); *C09K 11/0883* (2013.01);
(Continued)

(58) Field of Classification Search
None
See application file for complete search history.

(56) References Cited

U.S. PATENT DOCUMENTS 6,621,211 B1 * 9/2003 Srivastava ......... C09K 11/7734
                                                                257/103
2002/0063301 A1  5/2002 Hanamoto et al.
(Continued)

FOREIGN PATENT DOCUMENTS

EP    1278250 A2    1/2003
EP    1630220 A2    3/2006
(Continued)

OTHER PUBLICATIONS

Korean Patent Abstract (in English) of KR Pub. No. 1020090048589 A, Pub. Date May 14, 2009, downloaded on Jun. 29, 2016 from http://kpa.kipris.or.kr.
(Continued)

*Primary Examiner* — Michael Lebentritt
*Assistant Examiner* — Jordan Klein
(74) *Attorney, Agent, or Firm* — Barcelo, Harrison & Walker, LLP

(57) ABSTRACT

The present invention relates to a white light emitting device having high color rendering, and the white light emitting device is a white light emitting lamp comprising a blue LED chip having an excitation wavelength of 440-460 nm, and a phosphor layer covering a light emitting surface of the blue LED chip and excited by the excitation wavelength of the blue LED chip so as to emit light, wherein the phosphor layer comprises a first phosphor having an emission peak wavelength of 480-499 nm; a second phosphor having an emission peak wavelength of 500-560 nm; and a third phosphor having an emission peak wavelength of 600-650 nm. According to aspects of the present invention, a white LED chip having high color rendering can be provided, and
(Continued)

particularly, the white light emitting device having high color rendering for specific colors such as R9 and R12 can be provided.

3 Claims, 25 Drawing Sheets

(51) Int. Cl.
*C09K 11/77* (2006.01)
*C09K 11/02* (2006.01)

(52) U.S. Cl.
CPC ...... *C09K 11/7706* (2013.01); *C09K 11/7774* (2013.01); *Y02B 20/181* (2013.01)

(56) References Cited

U.S. PATENT DOCUMENTS

| | | | |
|---|---|---|---|
| 2006/0045832 A1* | 3/2006 | Nagatomi | C04B 35/581 423/325 |
| 2006/0091790 A1* | 5/2006 | Nagatomi | C04B 35/581 313/503 |
| 2006/0186377 A1 | 8/2006 | Takahashi et al. | |
| 2006/0197432 A1* | 9/2006 | Nagatomi | C04B 35/581 313/487 |
| 2007/0278935 A1* | 12/2007 | Harada | C09K 11/0883 313/503 |
| 2007/0284563 A1* | 12/2007 | Lee | H01L 25/0753 257/13 |
| 2008/0180948 A1 | 7/2008 | Yoon et al. | |
| 2008/0272688 A1 | 11/2008 | Yoshimura | |
| 2009/0146549 A1* | 6/2009 | Kimura | C09K 11/7734 313/503 |
| 2009/0166652 A1* | 7/2009 | Sakai | C09K 11/7734 257/98 |
| 2010/0219770 A1* | 9/2010 | Kim | H01L 25/0753 315/294 |
| 2011/0031874 A1 | 2/2011 | Hosokawa et al. | |
| 2011/0227477 A1* | 9/2011 | Zhang | B32B 18/00 313/503 |
| 2012/0187824 A1* | 7/2012 | Yamakawa | C09K 11/665 313/503 |
| 2013/0033167 A1 | 2/2013 | Dong et al. | |
| 2013/0234584 A1* | 9/2013 | Hattori | C09K 11/7734 313/503 |
| 2014/0265921 A1* | 9/2014 | Collins | F21V 19/00 315/297 |
| 2014/0299904 A1* | 10/2014 | Hattori et al. | C09K 11/0883 257/98 |
| 2015/0014725 A1* | 1/2015 | Hong | C09K 11/7721 257/98 |

FOREIGN PATENT DOCUMENTS

| | | |
|---|---|---|
| EP | 2056366 A1 | 5/2009 |
| EP | 2554631 A2 | 2/2013 |
| JP | 2002171000 A | 6/2002 |
| JP | 2005-285800 A | 10/2005 |
| JP | 2006-080443 A | 3/2006 |
| JP | 2006-176546 A | 7/2006 |
| JP | 2007-180377 A | 7/2007 |
| JP | 2007-191680 A | 8/2007 |
| JP | 2013-526007 A | 9/2011 |
| JP | 2011-225822 A | 11/2011 |
| JP | 2013-033971 A | 2/2012 |
| JP | 2012109532 A | 6/2012 |
| JP | 2013021339 A | 1/2013 |
| JP | 2013078336 A | 5/2013 |
| JP | 2013-187485 A | 9/2013 |
| KR | 10-2007-0119750 A | 12/2007 |
| KR | 20080063709 A | 7/2008 |
| KR | 10-2009-0048589 A | 5/2009 |
| KR | 10-2012-0043115 A | 5/2012 |
| KR | 20130018529 A | 2/2013 |
| KR | 20130027653 A | 3/2013 |
| KR | 20130079804 A | 7/2013 |
| KR | 10-2013-0103360 A | 9/2013 |
| WO | 0189001 A2 | 11/2001 |
| WO | 2005-087896 A1 | 9/2005 |
| WO | 2006/118104 A1 | 11/2005 |
| WO | 2011/033910 A1 | 3/2011 |
| WO | 2011/115820 A1 | 9/2011 |
| WO | 2013/061943 A1 | 5/2013 |

OTHER PUBLICATIONS

International Search Report, Int'l App. No. PCT/US2011/027990, (Int'l Pub. No. WO 2011/115820 A1, Pub. Date Sep. 22, 2011), date of mailing of the International search report: Jul. 21, 2011.
Japanese Patent Abstract (in English) of JP Pub. No. 2007-191680 A, Pub. Date Aug. 2, 2007, downloaded on Jun. 29, 2016 from https://www4.j-platpat.inpit.go.jp/.
Office Action dated May 14, 2015, Issued by Korean Intellectual Property Office, in App. No. 10-2014-0071997 (in Korean).
Office Action dated Feb. 23, 2016, Issued by Korean Intellectual Property Office, in App. No. 10-2014-0071997 (in Korean).
Korean Patent Abstract (in English) of KR Pub. No. 1020070119750 A, Pub. Date Dec. 20, 2007, downloaded on Feb. 17, 2016 from http://worldwide.espacenet.com.
Korean Patent Abstract (in English) of KR Pub. No. 1020120043115 A, Pub. Date May 3, 2012, downloaded on Feb. 17, 2016 from http://worldwide.espacenet.com.
Korean Patent Abstract (in English) of KR Pub. No. 1020130103360 A, Pub. Date Sep. 23, 2013, downloaded on Feb. 17, 2016 from http://worldwide.espacenet.com.
WIPO Patent Abstract (English/Japanese) of WIPO Pub. No. WO2013/061943 A1, Pub. Date May 2, 2013.
International Search Report (in English) of WIPO Pub. No, WO2013/061943 A1 (Int'l App. No, PCT/JP2012/077296), Pub. Date May 2, 2013.
International Search Report (in Japanese) WIPO Pub. No. WO2013/061943 A1 (Int'l App. No. PCT/JP2012/077296), Pub. Date May 2, 2013.
Japanese Patent Abstract (in English) of JP Pub. No. 2013-033971 A, downloaded on Nov. 24, 2016 from https://www4.j-platpat.inpit.go.jp/eng/.
Japanese Patent Abstract (in English) of JP Pub. No. 2011-225822 A, downloaded on Nov. 24, 2016 from https://www.4.j-platpat.inpit,go.jp/eng/.
WIPO Patent Abstract (English/Japanese) of WIPO Pub. No. W02011/033910 A1, Pub. Date Mar. 24, 2011.
International Search Report (in English) of WIPO Pub. No. WO2011/033910 A1 (Int'l App. No. PCT/JP2010/064382), Pub. Date Mar. 24, 2011.
International Search Report (in Japanese) of WIPO Pub. No. WO2011/033910 A1 (Int'l App. No. PCT/JP2010/064382), Pub. Date Mar. 24, 2011.
WIPO Patent Abstract (English/Japanese) of WIPO Pub. No. W02006/118104 A1, Pub. Date Nov. 9, 2006.
International Search Report (in English) of WIPO Pub. No. WO2006/118104 A1 (Int'l App. No. PCT/JP2006/308636), Pub. Date Nov. 9, 2006.
International Search Report (in Japanese) of WIPO Pub. No. WO2006/118104 A1 (Int'l App. No. PCT/JP2006/308636), Pub. Date Nov. 9, 2006.
Japanese Patent Abstract (in English) of JP Pub. No. 2013-187485 A, downloaded on Sep. 19, 2013 from https://www4.j-platpat.inpit.go.jp/eng.
Japanese Patent Abstract (in English) of JP Pub. No. 2012-109532 A, Pub. Date Jun. 7, 2012, downloaded on Sep. 17, 2017 from https://worldwide.espacenet.com/.
Office Action from China Patent & Trademark Office for App. No. 201430066061.6, dated Aug. 29, 2017.
Office Action from Japanese Patent Office for App. No. 2016-241369, dated Aug. 31, 2017.

(56) References Cited

OTHER PUBLICATIONS

International Search Report (in English) of European Patent App. No. 20130018529 A1 (PCT/JP2007/064861), Pub. Date May 6, 2009, dated Sep. 25, 2007 from Japanese Patent Office.
Partial European Search Report (in English) of European Patent App. No. 12177890 (EP2554631A2), Pub. Date Feb. 6, 2013, search completion Jul. 9, 2014 from European Patent Office (EPO).
Supplementary Partial European Search Report (in English) of European Patent App. No. 14850710, search completion Jun. 12, 2017 from European Patent Office (EPO).
Japanese Patent Abstract (in English) of JP Pub. No. 2006-080443 A, Pub. Date Mar. 23, 2006, downloaded on Jul. 27, 2017 from https://www4.j-platpat.inpit.go.jp/eng.
Japanese Patent Abstract (in English) of JP Pub. No. 2005-285800 A, Pub. Date Oct. 13, 2005, downloaded on Jul. 27, 2017 from https://www4.j-platpat.inpit.go.jp/eng.
Japanese Patent Abstract (in English) of JP Pub. No. 2006-176546 A, Pub. Date Jul. 6, 2006, downloaded on Jul. 27, 2017 from https://www4.j-platpat.inpit.go.jp/eng.
WIPO Patent Abstract (in English) of WO Pub, No. 2005-087896 A1, Pub. Date Sep. 22, 2005, downloaded on Jul. 27, 2017 from https://patentscope.wipo.int/search/en/.
European Patent Abstract (in English) of EP Pub. No. 1278250 A2, Pub. Date Jan. 22, 2003, downloaded on Jul. 27, 2017 from https://worldwide.espacenet.com/.
Japanese Patent Abstract (in English) of JP Pub. No. 2007-180377 A, Pub. Date Jul. 12, 2007, downloaded on Jul. 27, 2017 from https://www4.j-platpat. inpit.go.jp/eng.
Kijima, N. et al.; "A New Yellow Phoaphor $La_3Si_6N_{11}:Ce^{3+}$ for White LEDs"; ESC Transactions; Jan. 1, 2009, pp. 247-252.
Korean Patent Abstract (in English) of KR Pub. No. 20130018529 A, Pub. Date Feb. 25, 2013, downloaded on Mar. 21, 2017 from https://worldwide.espacenet.com/.
Korean Patent Abstract (in English) of KR Pub. No. 20130079804 A, Pub. Date Jul. 11, 2013, downloaded on Mar. 21, 2017 from https://worldwide.espacenet.com/.
Japanese Patent Abstract (in English) of JP Pub. No. 2013021339 A, Pub. Date Jan. 31, 2013, downloaded on Mar. 21, 2017 from https://worldwide.espacenet.com/
Japanese Patent Abstract (in English) of JP Pub. No. 2013078336 A, Pub. Date May 2, 2013, downloaded on Mar. 21, 2017 from https://worldwide.espacenet.com/.
Japanese Patent Abstract (in English) of JP Pub. No. 2002171000 A, Pub. Date Jun. 14, 2002, downloaded on Mar. 21, 2017 from https://worldwide.espacenet.com/.
Korean Patent Abstract (in English) of KR Pub. No. 20080063709 A, Pub. Date Jul. 7, 2008, downloaded on Mar. 21, 2017 from https://worldwide.espacenet.com/.
Korean Patent Abstract (in English) of KR Pub. No. 20130027653 A, Pub. Date Mar. 18, 2013, downloaded on Mar. 21, 2017 from https://worldwide.espacenet.com/.

\* cited by examiner

| NO | Chip Wd (nm) | 1st Phosphor 480-499nm (Ba,Eu)Si$_2$(O,cl)$_2$N$_2$ | 2nd Phosphor 500-560nm Al$_5$Lu$_3$O$_{12}$Ce$^{++}$ | 3rd Phosphor 600-650nm (Sr,Ca)AlSiN$_3$Eu | Silicone |
|---|---|---|---|---|---|
| Ex.1 | 440-450 | 5.3% | 9.7% | 2.5% | 82.5% |
| Ex.2 | 450-460 | 5.6% | 9.7% | 2.7% | 82.0% |
| Ex.3 | 440-450 | 5.2% | 9.7% | 2.4% | 82.7% |
| Ex.4 | 450-460 | 5.5% | 9.6% | 2.6% | 82.4% |
| Ex.5 | 440-450 | 4.2% | 9.5% | 1.8% | 84.6% |
| Ex.6 | 450-460 | 4.4% | 9.4% | 1.9% | 84.4% |
| Ex.7 | 440-450 | 2.9% | 8.4% | 1.3% | 87.5% |
| Ex.8 | 450-460 | 3.1% | 8.4% | 1.3% | 87.2% |
| Ex.9 | 440-450 | 2.9% | 7.5% | 1.2% | 88.4% |
| Ex.10 | 450-460 | 3.1% | 7.5% | 1.3% | 88.1% |
| Ex.11 | 440-450 | 2.8% | 6.6% | 1.0% | 89.5% |
| Ex.12 | 450-460 | 3.0% | 6.7% | 1.1% | 89.2% |

FIG. 2

| NO | Chip Wd (nm) | 1st Phosphor 430 – 470 nm $(Ba,Eu)Si_2(O,cl)_2N_2$ | 2nd Phosphor 500-560nm $Al_5Lu_3O_{12}Ce^{++}$ | 3rd Phosphor 600-650nm $(Sr,Ca)AlSiN_3Eu$ | Silicone |
|---|---|---|---|---|---|
| C.Ex.1 | 440-450 | 7.5% | 11.2% | 2.8% | 78.5% |
| C.Ex.2 | 450-460 | 7.3% | 11.8% | 3.0% | 78.0% |
| C.Ex.3 | 440-450 | 7.2% | 14.2% | 2.6% | 76.0% |
| C.Ex.4 | 450-460 | 7.4% | 14.4% | 2.8% | 75.5% |
| C.Ex.5 | 440-450 | 4.5% | 11.6% | 1.9% | 82.0% |
| C.Ex.6 | 450-460 | 4.8% | 11.5% | 2.0% | 81.7% |
| C.Ex.7 | 440-450 | 3.6% | 12.1% | 2.3% | 82.0% |
| C.Ex.8 | 450-460 | 3.5% | 11.6% | 2.4% | 82.5% |
| C.Ex.9 | 440-450 | 2.5% | 12.5% | 1.7% | 83.3% |
| C.Ex.10 | 450-460 | 2.5% | 12.3% | 1.7% | 83.6% |
| C.Ex.11 | 440-450 | 2.9% | 12.3% | 1.8% | 83.0% |
| C.Ex.12 | 450-460 | 3.0% | 12.5% | 1.9% | 82.6% |

FIG. 3

| No. | Wd | SN. | IF(mA) | VF(V) | iv(cd) | Tc(K) | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|---|---|---|---|---|---|
| Ex. 1 | 440-450 | 1 | 65 | 2.95 | 6.7 | 3156 | 96 | 97 | 97 | 96 | 93 | 96 | 94 | 97 | 97 | 95 | 93 | 91 | 95 | 97 | 98 | 98 |
| | | 2 | 65 | 2.95 | 6.6 | 3174 | 96 | 95 | 97 | 97 | 94 | 94 | 92 | 98 | 99 | 95 | 90 | 92 | 91 | 95 | 98 | 99 |
| Ex. 2 | 440-450 | 1 | 65 | 2.94 | 6.7 | 3199 | 96 | 97 | 97 | 97 | 94 | 96 | 94 | 98 | 98 | 95 | 92 | 90 | 93 | 97 | 98 | 99 |
| | | 2 | 65 | 2.94 | 6.7 | 3143 | 96 | 97 | 97 | 96 | 93 | 96 | 94 | 98 | 97 | 94 | 92 | 92 | 92 | 97 | 98 | 99 |
| Ex. 3 | 440-450 | 1 | 65 | 2.93 | 6.3 | 3467 | 96 | 96 | 98 | 98 | 93 | 95 | 96 | 99 | 99 | 98 | 93 | 92 | 94 | 96 | 99 | 99 |
| | | 2 | 65 | 2.93 | 6.5 | 3403 | 97 | 98 | 99 | 97 | 94 | 94 | 93 | 98 | 99 | 95 | 91 | 92 | 95 | 98 | 99 | 99 |
| Ex. 4 | 440-450 | 1 | 65 | 2.94 | 6.5 | 3181 | 96 | 96 | 97 | 95 | 94 | 94 | 93 | 98 | 98 | 93 | 91 | 92 | 91 | 96 | 99 | 99 |
| | | 2 | 65 | 2.95 | 6.4 | 3159 | 96 | 96 | 97 | 98 | 94 | 94 | 94 | 99 | 97 | 95 | 91 | 91 | 91 | 97 | 99 | 99 |
| Ex. 5 | 440-450 | 1 | 65 | 2.93 | 7.3 | 3953 | 96 | 97 | 99 | 97 | 94 | 95 | 94 | 99 | 99 | 95 | 92 | 92 | 92 | 97 | 99 | 98 |
| | | 2 | 65 | 2.93 | 7.1 | 3924 | 96 | 98 | 97 | 95 | 93 | 96 | 94 | 99 | 99 | 95 | 92 | 92 | 95 | 96 | 98 | 98 |
| Ex. 6 | 440-450 | 1 | 65 | 2.93 | 7.0 | 3464 | 96 | 96 | 99 | 98 | 93 | 94 | 94 | 98 | 99 | 99 | 96 | 92 | 94 | 96 | 98 | 99 |
| | | 2 | 65 | 2.92 | 7.1 | 3432 | 97 | 98 | 99 | 97 | 91 | 95 | 97 | 97 | 96 | 98 | 95 | 91 | 96 | 98 | 99 | 97 |
| Ex. 7 | 440-450 | 1 | 65 | 2.96 | 7.4 | 5047 | 96 | 99 | 99 | 98 | 98 | 93 | 98 | 96 | 96 | 92 | 97 | 94 | 92 | 99 | 98 | 97 |
| | | 2 | 65 | 2.93 | 7.3 | 5000 | 98 | 99 | 99 | 98 | 92 | 95 | 98 | 97 | 95 | 93 | 96 | 92 | 91 | 98 | 99 | 97 |
| Ex. 8 | 440-450 | 1 | 65 | 2.93 | 7.4 | 5028 | 97 | 97 | 99 | 98 | 91 | 93 | 98 | 97 | 97 | 98 | 96 | 91 | 92 | 98 | 99 | 96 |
| | | 2 | 65 | 2.94 | 7.4 | 5176 | 95 | 99 | 99 | 98 | 93 | 96 | 97 | 97 | 97 | 95 | 96 | 91 | 96 | 99 | 99 | 96 |
| Ex. 9 | 440-450 | 1 | 65 | 2.92 | 7.6 | 5584 | 97 | 98 | 99 | 98 | 92 | 96 | 97 | 98 | 97 | 93 | 95 | 92 | 94 | 98 | 98 | 98 |
| | | 2 | 65 | 2.92 | 7.6 | 5711 | 97 | 98 | 99 | 98 | 94 | 96 | 99 | 98 | 98 | 96 | 95 | 93 | 93 | 98 | 99 | 98 |
| Ex. 10 | 440-450 | 1 | 65 | 2.91 | 7.4 | 5755 | 97 | 99 | 99 | 98 | 93 | 96 | 98 | 96 | 97 | 95 | 95 | 93 | 93 | 99 | 98 | 99 |
| | | 2 | 65 | 2.92 | 7.5 | 5622 | 97 | 98 | 99 | 98 | 95 | 96 | 99 | 98 | 98 | 96 | 98 | 91 | 97 | 99 | 99 | 98 |
| Ex. 11 | 440-450 | 1 | 65 | 3.05 | 8.0 | 6495 | 98 | 99 | 100 | 98 | 92 | 96 | 98 | 98 | 97 | 93 | 94 | 94 | 94 | 98 | 99 | 99 |
| | | 2 | 65 | 3.08 | 7.9 | 6649 | 97 | 99 | 99 | 98 | 90 | 95 | 99 | 95 | 96 | 92 | 97 | 94 | 91 | 99 | 99 | 99 |
| Ex. 12 | 440-450 | 1 | 65 | 3.03 | 7.9 | 6530 | 97 | 99 | 99 | 98 | — | — | 99 | — | — | — | 98 | 94 | 91 | 99 | 99 | 98 |
| | | 2 | 65 | 3.03 | 8.0 | 6518 | 96 | 99 | 99 | 98 | 90 | 95 | 99 | 95 | 96 | 92 | 98 | 94 | 92 | 99 | 99 | 98 |

FIG. 4

| No. | Wd | SN. | IF(mA) | VF(V) | iv(cd) | Tc(K) | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|---|---|---|---|---|---|
| CEx 1 | 440-450 | 1 | 65 | 2.9 | 6.6 | 3161 | 90 | 90 | 94 | 95 | 92 | 89 | 82 | 93 | 89 | 74 | 89 | 82 | 82 | 90 | 96 | 85 |
| CEx 1 | | 2 | 65 | 2.9 | 6.6 | 3150 | 90 | 93 | 92 | 93 | 94 | 92 | 80 | 91 | 83 | 77 | 91 | 83 | 83 | 93 | 97 | 90 |
| CEx 2 | 450-460 | 1 | 65 | 2.9 | 6.5 | 3153 | 94 | 95 | 89 | 89 | 94 | 94 | 79 | 88 | 74 | 81 | 91 | 83 | 77 | 94 | 95 | 91 |
| CEx 2 | | 2 | 65 | 2.9 | 6.6 | 3161 | 95 | 94 | 89 | 90 | 95 | 94 | 80 | 87 | 78 | 82 | 92 | 82 | 76 | 94 | 96 | 92 |
| CEx 3 | 440-450 | 1 | 65 | 2.9 | 6.4 | 3484 | 95 | 96 | 98 | 97 | 96 | 95 | 77 | 96 | 95 | 67 | 94 | 85 | 78 | 97 | 98 | 98 |
| CEx 3 | | 2 | 65 | 2.9 | 6.5 | 3587 | 95 | 96 | 98 | 97 | 90 | 95 | 77 | 96 | 95 | 66 | 98 | 85 | 78 | 97 | 98 | 98 |
| CEx 4 | 450-460 | 1 | 65 | 2.9 | 6.5 | 3648 | 97 | 96 | 99 | 97 | 91 | 95 | 77 | 97 | 96 | 70 | 99 | 88 | 72 | 97 | 98 | 98 |
| CEx 4 | | 2 | 65 | 2.9 | 6.4 | 3546 | 96 | 99 | 99 | 98 | 90 | 95 | 77 | 97 | 96 | 71 | 99 | 89 | 71 | 96 | 98 | 99 |
| CEx 5 | 440-450 | 1 | 65 | 3.0 | 7.2 | 3968 | 95 | 98 | 99 | 98 | 95 | 98 | 76 | 95 | 88 | 68 | 98 | 88 | 81 | 98 | 97 | 94 |
| CEx 5 | | 2 | 65 | 3.0 | 7.2 | 3969 | 93 | 99 | 99 | 97 | 95 | 98 | 75 | 96 | 87 | 67 | 98 | 90 | 79 | 98 | 98 | 93 |
| CEx 6 | 450-460 | 1 | 65 | 3.0 | 7.1 | 4048 | 97 | 99 | 99 | 98 | 94 | 99 | 74 | 98 | 88 | 71 | 98 | 90 | 76 | 99 | 98 | 93 |
| CEx 6 | | 2 | 65 | 2.9 | 7.1 | 3879 | 95 | 92 | 97 | 93 | 94 | 94 | 74 | 96 | 86 | 73 | 99 | 91 | 75 | 95 | 95 | 94 |
| CEx 7 | 440-450 | 1 | 65 | 2.9 | 7.2 | 5157 | 94 | 97 | 96 | 95 | 94 | 95 | 83 | 96 | 95 | 75 | 89 | 89 | 76 | 96 | 97 | 98 |
| CEx 7 | | 2 | 65 | 2.9 | 7.2 | 5128 | 94 | 96 | 96 | 95 | 94 | 94 | 82 | 98 | 96 | 73 | 90 | 90 | 69 | 96 | 97 | 99 |
| CEx 8 | 450-460 | 1 | 65 | 2.9 | 7.1 | 5080 | 96 | 96 | 96 | 95 | 95 | 95 | 82 | 96 | 95 | 78 | 91 | 90 | 73 | 96 | 97 | 98 |
| CEx 8 | | 2 | 65 | 2.9 | 7.1 | 5155 | 96 | 96 | 95 | 95 | 95 | 94 | 80 | 95 | 95 | 78 | 90 | 89 | 72 | 96 | 97 | 99 |
| CEx 9 | 440-450 | 1 | 65 | 2.9 | 7.6 | 5507 | 93 | 97 | 96 | 94 | 94 | 94 | 78 | 95 | 93 | 74 | 87 | 89 | 80 | 95 | 96 | 99 |
| CEx 9 | | 2 | 65 | 2.9 | 7.7 | 5609 | 93 | 96 | 92 | 94 | 96 | 95 | 79 | 95 | 94 | 77 | 88 | 91 | 78 | 96 | 96 | 99 |
| CEx 10 | 450-460 | 1 | 65 | 2.9 | 7.6 | 5477 | 95 | 97 | 92 | 94 | 96 | 96 | 78 | 95 | 92 | 79 | 88 | 90 | 76 | 96 | 96 | 99 |
| CEx 10 | | 2 | 65 | 2.9 | 7.6 | 5437 | 95 | 96 | 92 | 93 | 97 | 96 | 79 | 97 | 93 | 78 | 88 | 92 | 75 | 95 | 96 | 99 |
| CEx 11 | 440-450 | 1 | 65 | 3.1 | 7.0 | 6698 | 92 | 89 | 92 | 98 | 91 | 91 | 81 | 98 | 96 | 83 | 82 | 86 | 76 | 96 | 96 | 90 |
| CEx 11 | | 2 | 65 | 3.1 | 7.2 | 6637 | 92 | 90 | 92 | 98 | 92 | 91 | 80 | 97 | 96 | 85 | 85 | 86 | 73 | 97 | 98 | 89 |
| CEx 12 | 450-460 | 1 | 65 | 3.1 | 7.1 | 6625 | 94 | 90 | 93 | 98 | 93 | 91 | 81 | 97 | 96 | 83 | 86 | 88 | 68 | 90 | 98 | 89 |
| CEx 12 | | 2 | 65 | 3.0 | 7.2 | 6686 | 94 | 89 | 92 | 97 | 92 | 91 | 80 | 97 | 96 | 83 | 85 | 89 | 69 | 89 | 98 | 89 |

FIG. 5

WHITE LIGHT EMITTING DEVICE HAVING HIGH COLOR RENDERING

CROSS-REFERENCE TO RELATED APPLICATIONS

This application is the national stage for International Patent Cooperation Treaty Application PCT/KR2014/007614, filed Aug. 18, 2014, which claims priority from Korean Patent Application No. 10-2013-0117971, filed on Oct. 2, 2013, in the Korean Intellectual Property Office; Korean Patent Application No. 10-2014-0071997, filed on Jun. 13, 2014, in the Korean Intellectual Property Office. The entire contents of said applications are incorporated herein by reference for all purposes.

BACKGROUND (a) Technical Field

The present invention relates to a white LED device for illumination, and more particularly, to a white LED device for illumination with high color rendering properties using a blue LED chip having high luminance as an excitation light source.

(b) Background Art

With the commercialization of blue LEDs in the late 1990s, white LED devices have appeared, which employ a phosphor such as YAG (Yttrium Aluminum Garnet) for emitting yellow light by absorbing the excitation light at the corresponding wavelength using a blue LED chip as an excitation light source. This white LED has high luminance but is problematic because the wavelength interval between blue and yellow is wide, thus making it difficult to achieve mass production of white LEDs having the same color coordinates due to the scintillation effect by the color separation. Furthermore, it is very difficult to adjust color temperature (CT) and color rendering index (CRI), which are regarded as important in a light source for illumination. The CRI of typical white LEDs is only 75~80.

Hence, white LED devices have been developed by applying an R/G/B multilayer fluorescent material on a UV LED chip to thus exhibit superior color stability and a wide emission spectrum as in incandescent bulbs. CT and CRI in such white LEDs are easy to adjust and thus white LEDs are receiving attention as a light source of an LED for illumination (Japanese Patent Application Publication No. 2002-171000). However, this patent is problematic because the white LED using the UV chip as an excitation light source has low luminance, compared to white LED devices using blue LED chips.

In addition, methods of emitting white light by combining multiple LED chips such as R/G/B have been proposed, but have drawbacks, such as non-uniform driving voltage per chip, and changes in the power of chips depending on the ambient temperature, which thus produces different color coordinates.

Although a variety of methods have been devised to achieve white LEDs as mentioned above, thorough research is ongoing into white LEDs using green and red phosphors instead of the yellow phosphor, with the use of a blue LED as an excitation light source due to high luminance of the blue LED (Korean Patent Application Publication No. 2008-0063709). In this case, color reproducibility may be increased to some extent, but is still insufficient. For example, a white LED lamp including green and red phosphors has low CRI for specific colors such as R9 (Red) or R12 (Blue).

Furthermore, because of instability of the material for the phosphor, such as damage to the red or green phosphor of the white LED device due to external energy or the like, unreliable products may result.

Technical Problem

Accordingly, the present invention has been made keeping in mind the problems encountered in the related art, and aspects of the present invention are intended to provide a high color-rendering white LED chip using a blue LED chip as an excitation light source.

In addition, aspects of the present invention are intended to provide a white light emitting device, which may emit white light close to natural light by optimizing the composition and mixing ratio of individual phosphors to achieve high color rendering properties and high light luminance.

Technical Solution

Aspects of the present invention provide a white light emitting device, comprising a blue LED chip having an excitation wavelength of 440~460 nm and a phosphor layer excited by the excitation wavelength of the blue LED chip to emit light, wherein the phosphor layer comprises: a first phosphor having an emission peak wavelength of 480~499 nm; a second phosphor having an emission peak wavelength of 500~560 nm; and a third phosphor having an emission peak wavelength of 600~650 nm.

Preferably, the white light emitting device has an average color rendering index of 90% or more and R12 of 90% or more.

More preferably, the white light emitting device has R9 of 90% or more.

Also, the white light emitting device may have a peak wavelength in the range of 485~504 nm in an emission spectrum.

Preferably, the white light emitting device has three or more peak wavelengths in different wavelength bands in the emission spectrum.

In addition, aspects of the present invention provide a white light emitting device, comprising a blue LED chip having an excitation wavelength of 440~460 nm and a phosphor layer excited by the excitation wavelength of the blue LED chip to emit light, wherein the phosphor layer includes at least three phosphors having emission peak wavelengths in the range of 480~650 nm, and the white light emitting device has a peak wavelength in the range of 485~504 nm in an emission spectrum.

Preferably, the white light emitting device has three or more peak wavelengths in different wavelength bands in the emission spectrum.

As such, the white light emitting device may have an average color rendering index of 90% or more and a color rendering index R12 of 90% or more, and furthermore, may have a color rendering index R9 of 90% or more.

Advantageous Effects

According to aspects of the present invention, a high color-rendering white LED chip using a blue LED chip as an excitation light source can be provided. The white LED chip can exhibit high color rendering properties for specific colors such as R9 and R12.

Also, the wavelength band and the mixing ratio of individual phosphors can be appropriately adjusted with the use of a blue LED chip as an excitation light source, thus achieving high color rendering properties including both R9 and R12 of 90% or more, making it possible to provide an LED device for emitting light close to solar light.

BRIEF DESCRIPTION OF THE DRAWINGS

FIG. 2 illustrates Examples 1 to 12 for a white LED device according to aspects of the present invention;

FIG. 3 illustrates Comparative Examples 1 to 12 for a white LED device for comparison with the present invention;

FIG. 4 illustrates the results of evaluation of color rendering properties of Examples 1 to 12 according to aspects of the present invention;

FIG. 5 illustrates the results of evaluation of color rendering properties of Comparative Examples 1 to 12;

DETAILED DESCRIPTION

Best Mode

To fully understand the present invention, the advantages in the operation of the present invention, and the objects accomplished by the implementations of the present invention, reference should be made to exemplary embodiments of the present invention.

In the following description of the present invention, detailed descriptions of known constructions and functions incorporated herein will be omitted when it may make the subject matter of the present invention unclear.

Figure 1:
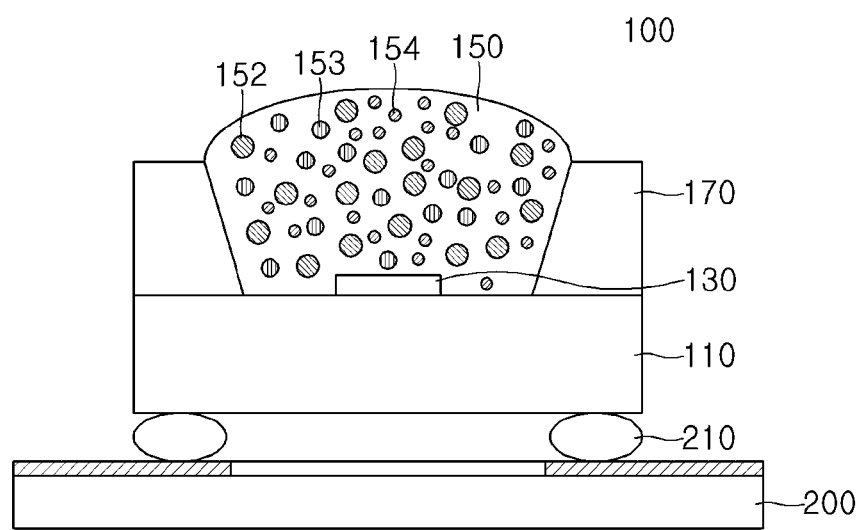
FIG. 1 illustrates a white LED device according to a preferred embodiment of the present invention.

FIG. 1 illustrates a white LED device according to a preferred embodiment of the present invention.

As illustrated in FIG. 1, an LED device 100 includes a base substrate 110 and an LED chip 130 mounted thereon. The LED device 100 is bonded onto a metal-based substrate (metal PCB) 200 by a ball grid array 210 using surface mount technology (SMT), thus forming an LED package. This package structure shows an exemplary embodiment that employs the LED device according to the present invention, and the present invention may be applied to the other packaging methods.

Provided on the base substrate 110 of the LED device 100 is a frame 170 having a predetermined shape, for example, a cylindrical shape, and the inner surface of the frame is provided with a reflector for efficiently reflecting light emitted from the LED chip 130. Although not shown, one electrode of the LED chip 130 may be electrically connected to a frame 170 by means of a bonding wire. Also, the other electrode of the LED chip 130 may be electrically connected to a metal wire on the base substrate.

The LED chip 130 includes a light emitting diode having a peak wavelength of 440~460 nm. The light emitting diode may include for example an InGaN- or GaN-based light emitting diode. Instead of the LED chip, the other light emitting device such as a laser diode may be used in the present invention, which will be apparent to those skilled in the art.

The LED chip 130 is covered with a phosphor layer 150. The phosphor layer 150 includes at least three phosphors 152, 153, 154 having different emission peak wavelengths, which are excited by the emission wavelength of the LED chip 130 to emit light at a predetermined wavelength. In the present invention, the phosphors are preferably provided in the form of powder. To this end, the phosphor layer 150 may include a transparent resin for dispersing and fixing the phosphor and sealing the LED chip 130.

In the present invention, the transparent resin may include typical silicone resin or epoxy resin.

In the present invention, the phosphors 152, 153, 154 have different fluorescent material compositions and thus exhibit different emission peak wavelengths. Preferably, the phosphors 152, 153, 154 include at least three fluorescent materials having different emission wavelengths in the range of 480~650 nm. In an embodiment of the present invention, the phosphors 152, 153, 154 include a first phosphor B for emitting blue light, a second phosphor G for emitting green light, and a third phosphor R for emitting red light, after having been excited by light emitted from the LED chip. In the present invention, the first, the second and the third phosphor are preferably composed of an oxide or a nitride.

In the present invention, the first phosphor is excited by light emitted from the LED chip 130, thus emitting light having a peak wavelength in the range of 480~499 nm. The emission peak wavelength of the first phosphor is greater than the peak wavelength of light emitted from the LED chip 130.

In the present invention, the first phosphor B, which is a phosphor for emitting blue light, preferably includes a fluorescent material represented by Chemical Formula 1 below.

$(Ba,Eu)Si_x(O,Cl)_xN_x$ (1<x<5)  (Chemical Formula 1)

In the present invention, the second phosphor is excited by light emitted from the LED chip 130, thus emitting light having a peak wavelength in the range of 500~560 nm. The second phosphor, which is a phosphor for emitting green light, may include fluorescent materials represented by Chemical Formulas 2 to 4 below, which may be used alone or in combination.

$(Sr,Ba,Ca)_xSiO_{2x}:Eu$ (1<x<5)  (Chemical Formula 2)

$Si_{6-y}Al_yO_yN_{8-y}:Eu$ (0.1<y<0.5)  (Chemical Formula 3)

$Al_{8-z}Lu_zO_{12}:Ce^{++}$ (1<z<5)  (Chemical Formula 4)

In the present invention, the third phosphor is excited by light emitted from the LED chip 130, thus emitting light having a peak wavelength in the range of 600~650 nm. The third phosphor may include fluorescent materials represented by Chemical Formulas 5 and 6 below, which may be used alone or in combination.

  (Chemical Formula 5)

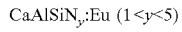  (Chemical Formula 6)

Below is a description for examples and comparative examples for a high color-rendering white light emitting device according to the present invention and the results of evaluation of color rendering properties thereof.

Examples 1 to 12

In Examples 1 to 12 according to the present invention, a first phosphor comprising $(Ba,Eu)Si_2(O,Cl)_2N_2$ having an emission peak wavelength of 480~499 nm with D50 of 15±3 μm, a second phosphor comprising $Al_5Lu_3O_{12}:Ce^{++}$ having an emission peak wavelength of 500~560 nm with D50 of 12±3 μm, and a third phosphor comprising $(Sr,Ca)AlSiN_3$:Eu having an emission peak wavelength of 600~650 nm with D50 of 11±3 μm were prepared.

The first phosphor, the second phosphor, the third phosphor and a silicone resin were mixed at a mixing ratio as shown in FIG. 2, thus obtaining a sludge, which was then applied on a blue LED chip and thermally treated at 150~180° C. to cure the silicone resin, thereby manufacturing a white LED device as illustrated in FIG. 1. In Examples 1, 3, 5, 7, 9 and 11, an LED chip having an emission peak wavelength of 440~450 nm was used, and in Examples 2, 4, 6, 8, 10 and 12, an LED chip having an emission peak wavelength of 450~460 nm was employed.

Comparative Examples 1 to 12

In Comparative Examples 1 to 12, a first phosphor comprising $(Ba,Eu)Si_2(O,Cl)_2N_2$ having an emission peak wavelength of 430~470 nm was prepared, and second and third phosphors having the same emission peak wavelengths and compositions as in Examples 1 to 12 were prepared.

The first phosphor, the second phosphor, the third phosphor and a silicone resin were mixed at a mixing ratio as shown in FIG. 3 thus obtaining a sludge, which was then applied on a blue LED chip and thermally treated at 150~180° C. to cure the silicone resin, thereby manufacturing a white LED device as illustrated in FIG. 1. In Comparative Examples 1, 3, 5, 7, 9 and 11, an LED chip having an emission peak wavelength of 440~450 nm was utilized, and in Comparative Examples 2, 4, 6, 8, 10 and 12, an LED chip having an emission peak wavelength of 450~460 nm was used.

The white light emitting devices of Examples 1 to 12 and Comparative Examples 1 to 12 were measured for color rendering properties.

FIG. 4 illustrates the results of evaluation of the color rendering properties of the white light emitting devices of Examples 1 to 12, and FIG. 5 illustrates the results of evaluation of the color rendering properties of the white light emitting devices of Comparative Examples 1 to 12.

In FIGS. 4 and 5, the white LED device samples were measured for correlated color temperature (CCT), luminance and CRI under the condition that a current of 65 mA was applied to each device, using a CAS 140 spectrometer made by Instrument and a MCPD system made by Otsuka Denshi according to Japanese Industrial Standard (JIS Z 8726~1990).

Based on the measurement results of FIG. 4, Examples 1 to 12 exhibited the color rendering index Ra of 96% or more in the color temperature range from 3000K to 6500K, and all the color indices from R1 to R15 were 90% or more, thus manifesting high color rendering properties, which are stable and uniform. For specific colors, R9 was in the range from 90% to 98%, and R12 fell in the range from 90% to 97%.

On the other hand, based on the measurement results of FIG. 5, Comparative Examples 1 to 12 had relatively stable Ra of 90~94%, from which Ra was increased by 5% or more in Examples 1 to 12 than in Comparative Examples 1 to 12. Also, in Comparative Examples 1 to 12, some of the color indices from R1 to R15 were lowered to the level of about 60%. For specific colors, R9 was merely in the range of about 60~70%, and R12 approximated to 80%. Hence, R9 and R12 in Examples 1 to 12 were much higher.

As for the emission spectra of the above examples and comparative examples, FIGS. 6 to 11 illustrate the emission spectra of Examples 1, 3, 5, 7, 9 and 11 and Comparative Examples 1, 3, 5, 7, 9 and 11. In respective drawings, (a) shows the emission spectrum of the comparative example, (b) shows the emission spectrum of the example, and (c) shows the emission spectra of both of the example and the comparative example.

Figure 6A:
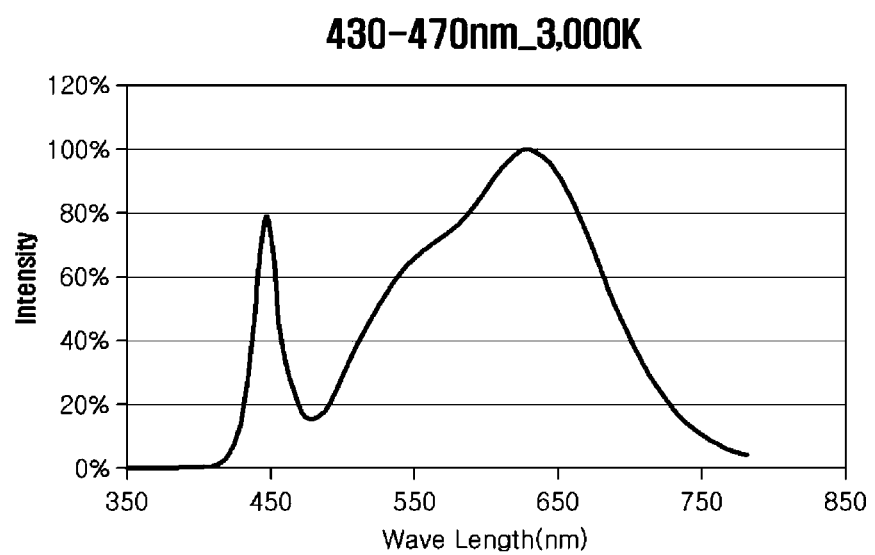
FIG. 6 illustrates the emission spectra of Comparative Example 1 and Example 1 according to aspects of the present invention.
Figure 6B:
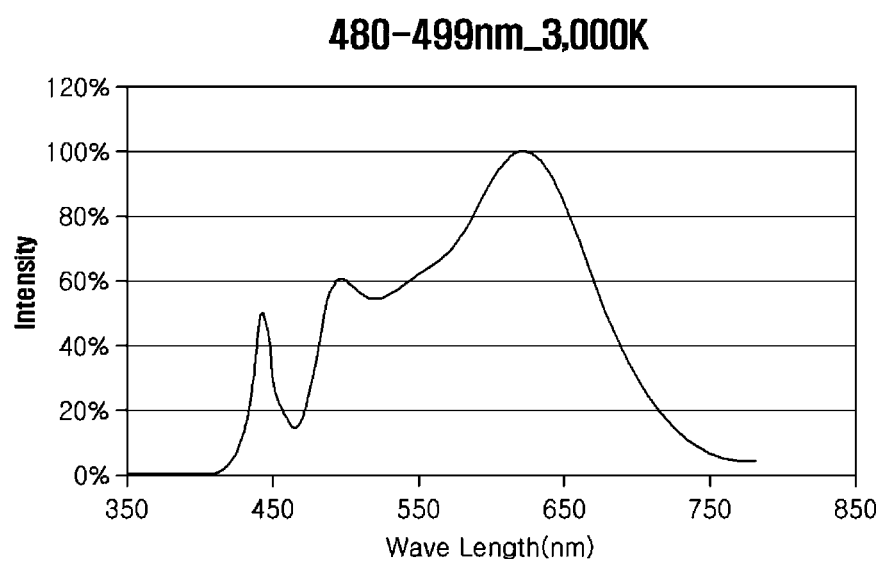
Figure 6C:
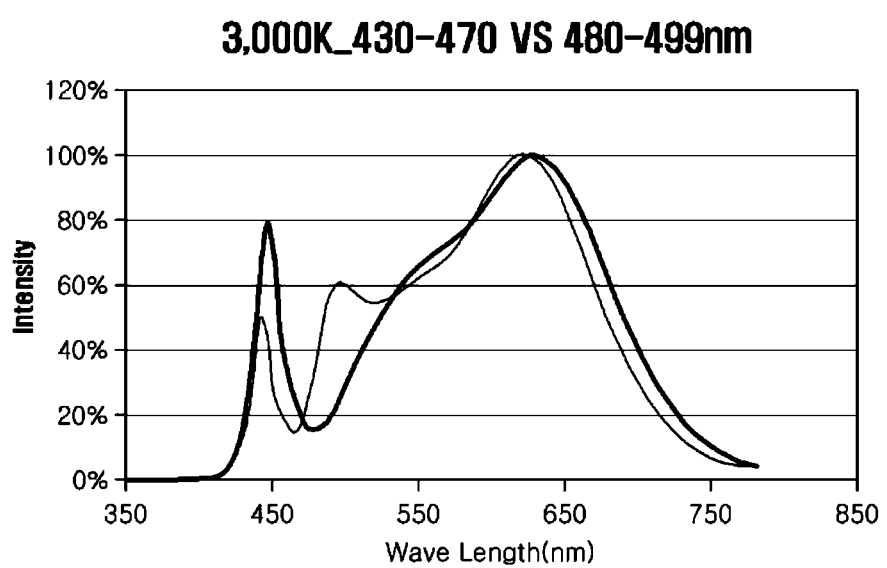

As illustrated in FIG. 6, Example 1 shows the much higher numeral value in the wavelength band of 480~510 nm at a color temperature of 3000K, compared to Comparative Example 1.

Figure 7A:
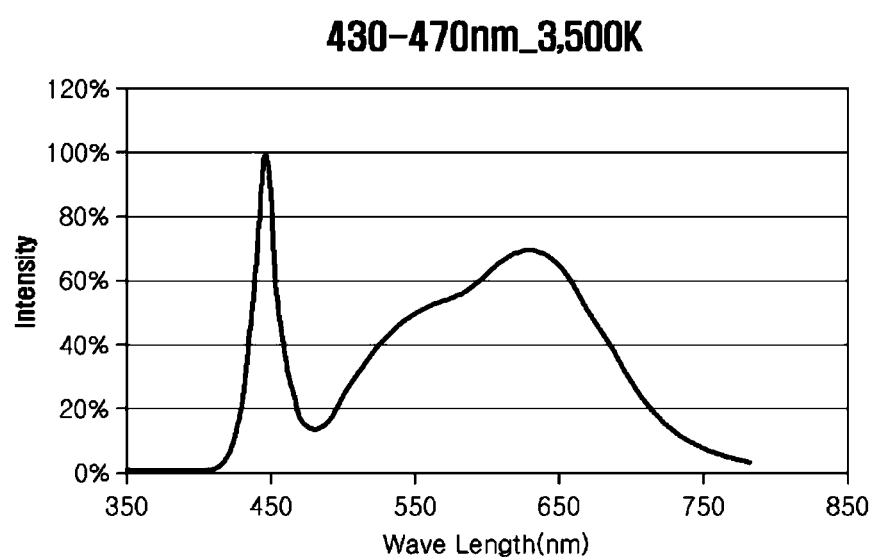
FIG. 7 illustrates the emission spectra of Comparative Example 3 and Example 3 according to aspects of the present invention.
Figure 7B:
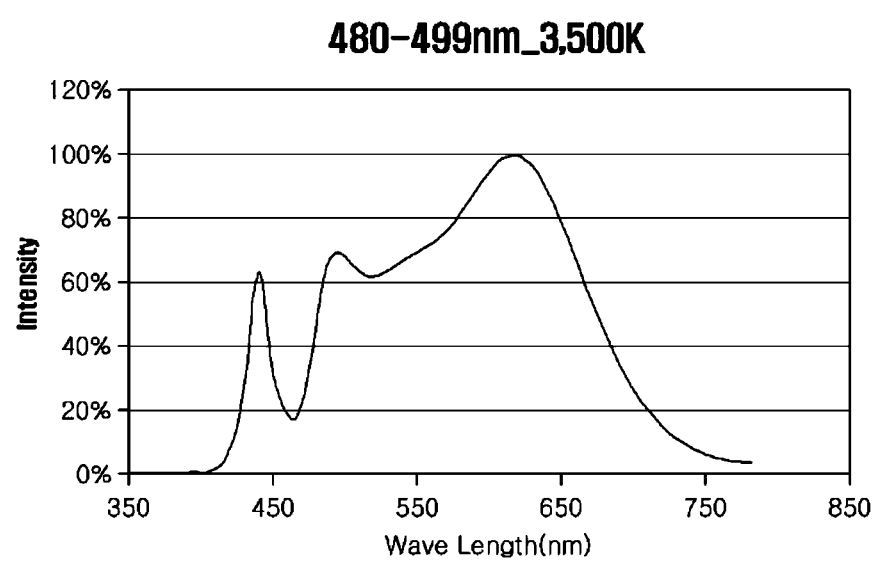
Figure 7C:
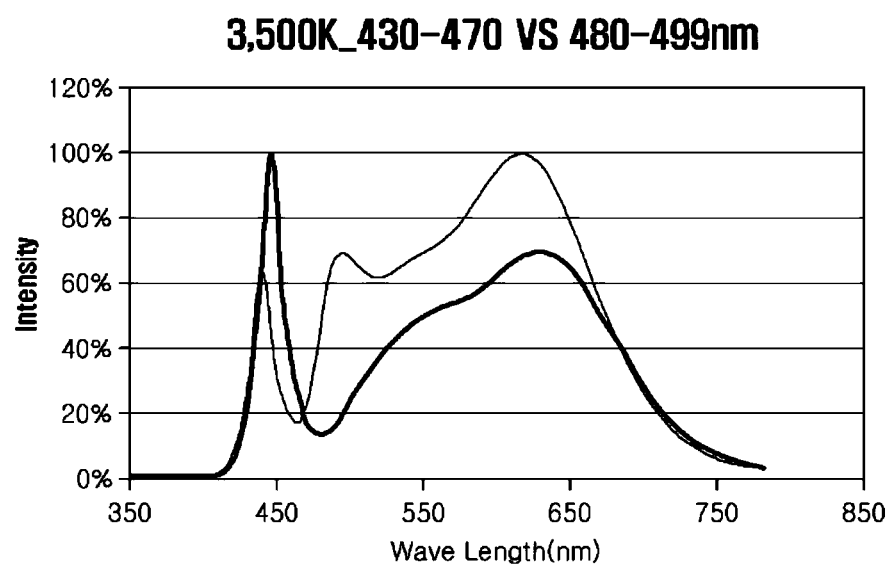
Figure 8A:
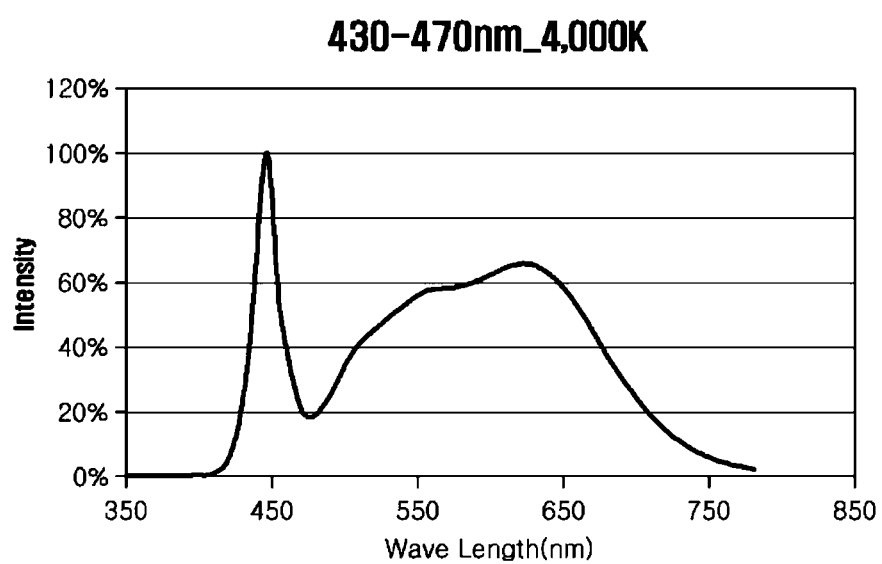
FIG. 8 illustrates the emission spectra of Comparative Example 5 and Example 5 according to aspects of the present invention.
Figure 8B:
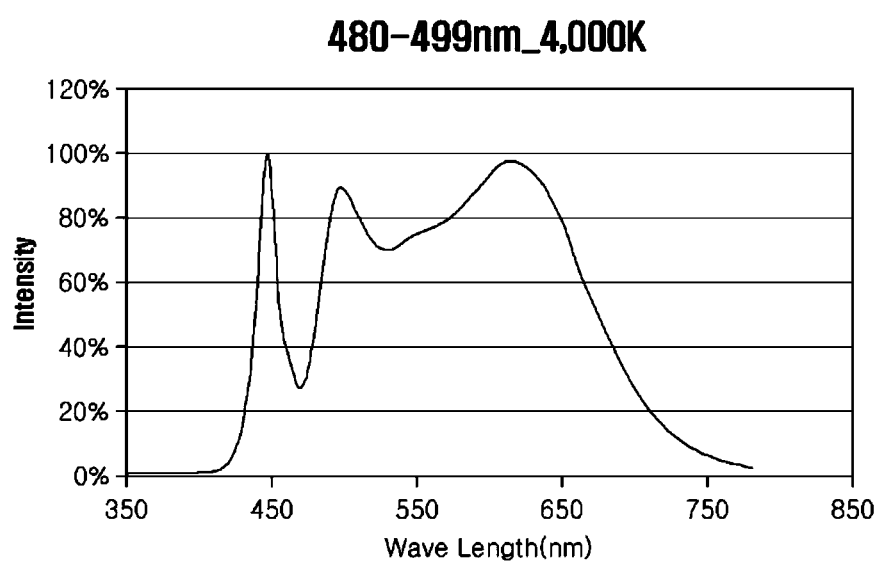
Figure 8C:
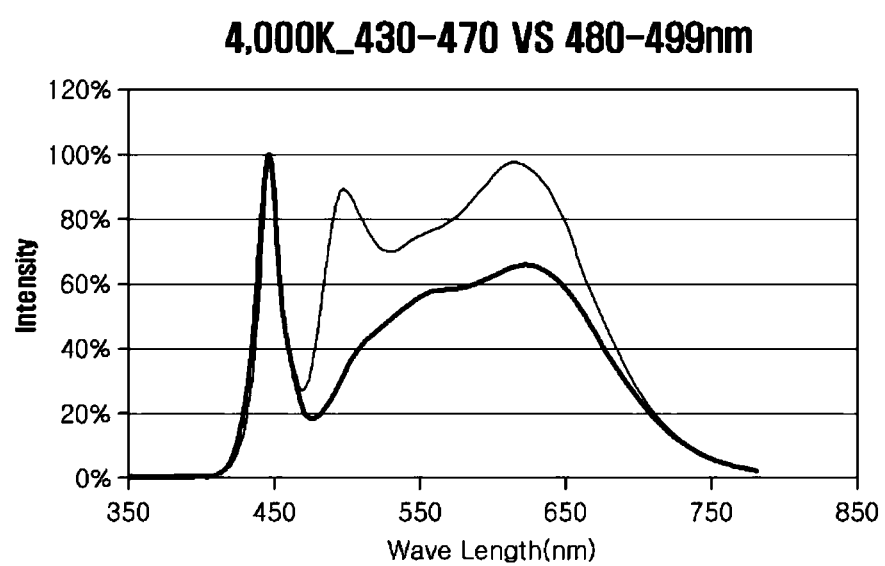
Figure 9A:
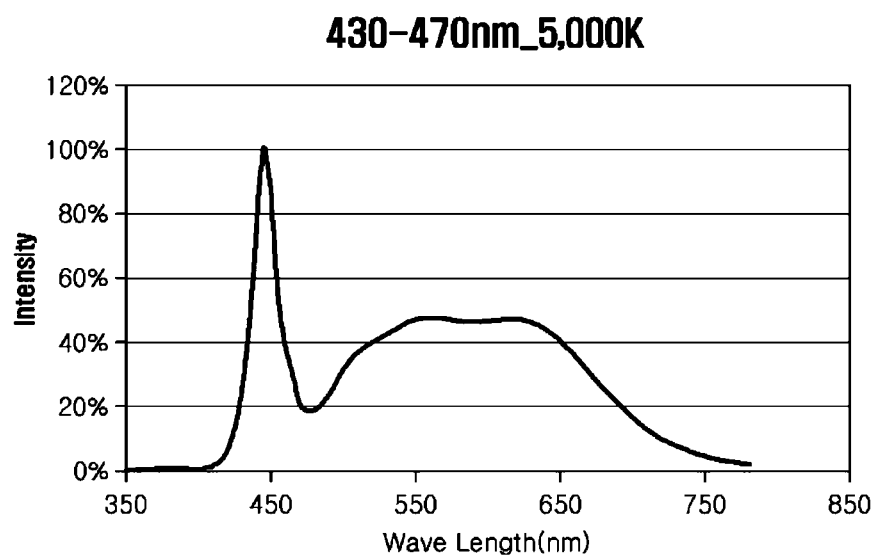
FIG. 9 illustrates the emission spectra of Comparative Example 7 and Example 7 according to aspects of the present invention.
Figure 9B:
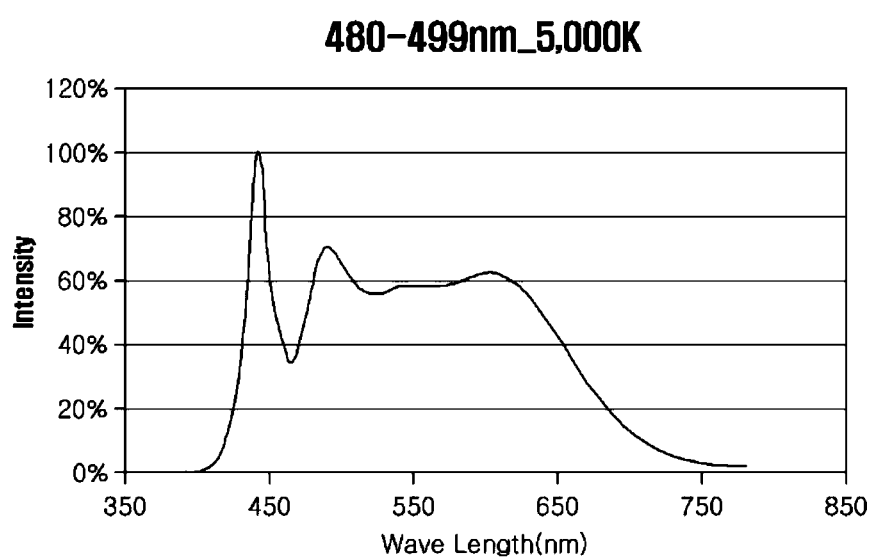
Figure 9C:
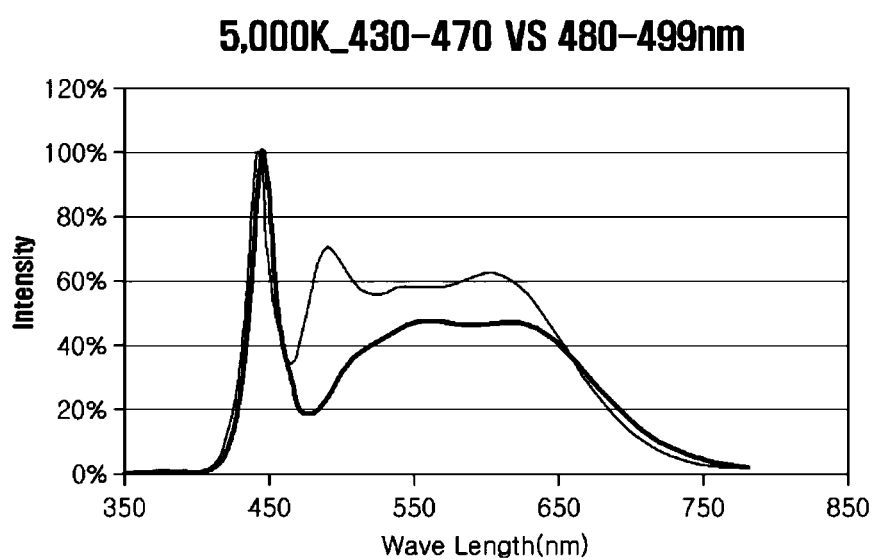
Figure 10A:
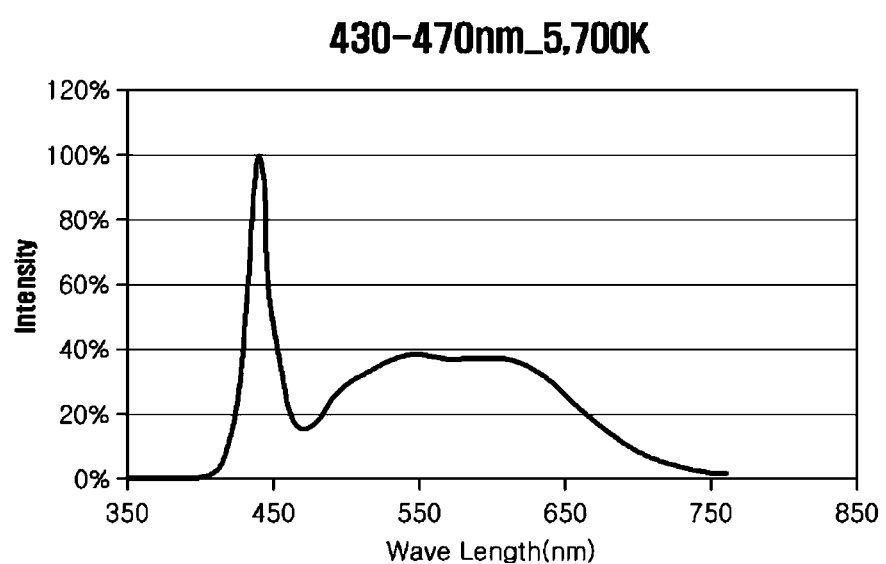
FIG. 10 illustrates the emission spectra of Comparative Example 9 and Example 9 according to aspects of the present invention.
Figure 10B:
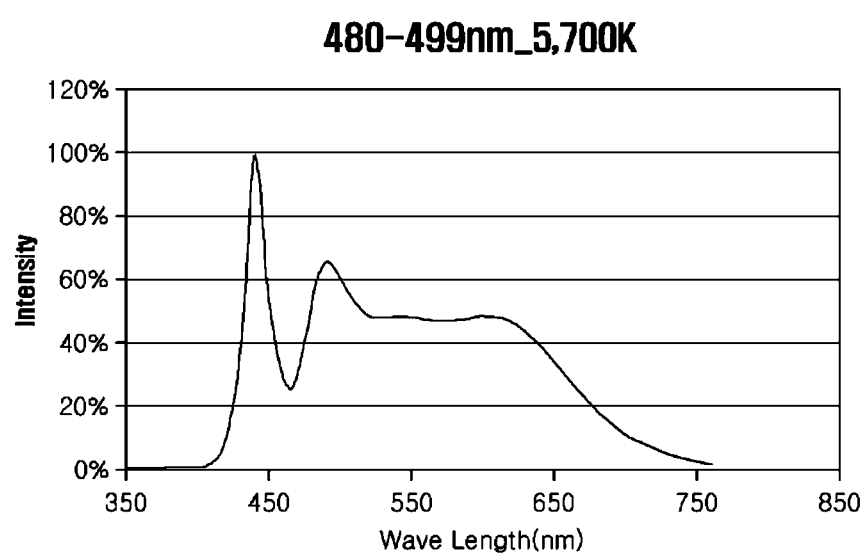
Figure 10C:
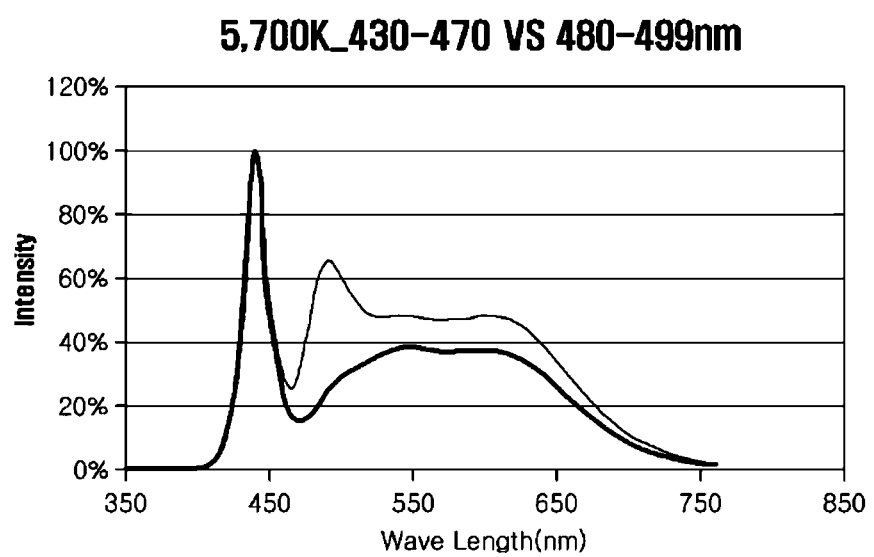
Figure 11A:
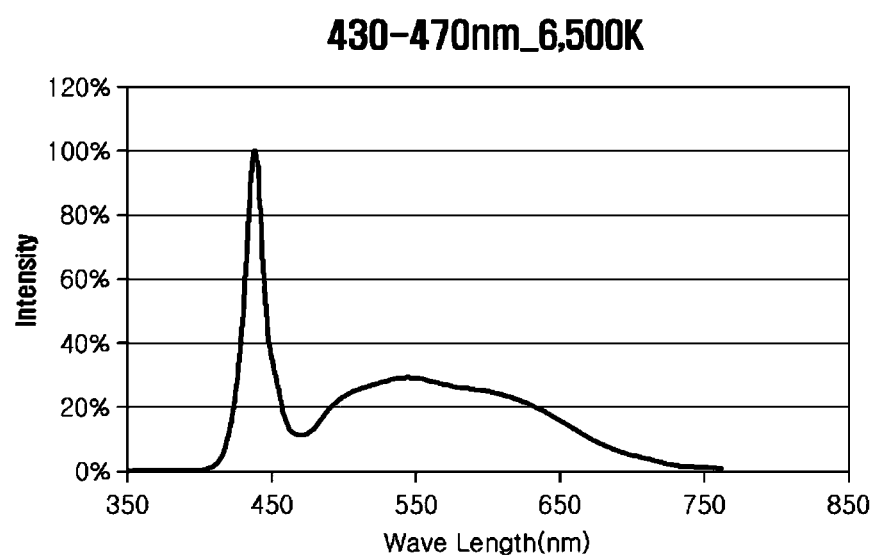
FIG. 11 illustrates the emission spectra of Comparative Example 11 and Example 11 according to aspects of the present invention.
Figure 11B:
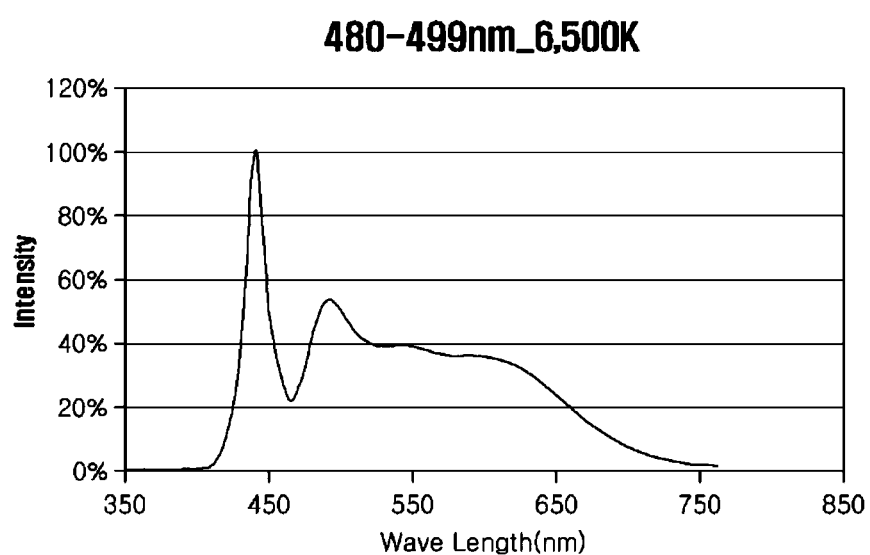
Figure 11C:
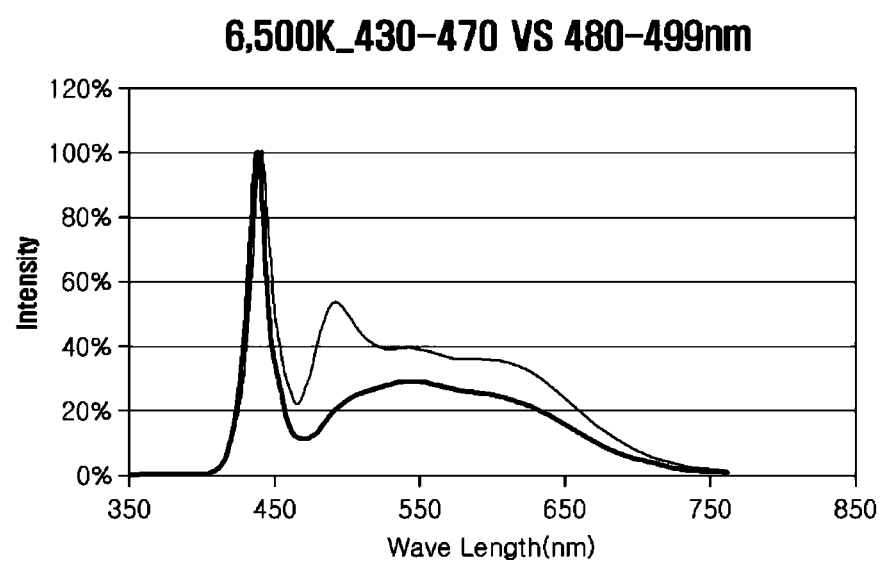

As illustrated in FIGS. 7 and 8, the numeral values of the emission wavelength bands corresponding to specific color indices (R9~R15) at the color temperatures of 3500K and 4000K were much higher in Examples 3 and 5 than in Comparative Examples 3 and 5. Moreover, as illustrated in FIGS. 9 to 11, the numeral values of the emission wavelength bands corresponding to specific color indices (R9~R15) in the color temperature range from 5000K to 6500K were remarkably higher in Examples 7, 9 and 11 than in Comparative Examples 7, 9 and 11.

FIG. 12 illustrates the overall results of the emission spectra of FIGS. 6 to 11, in which (a) shows the emission spectra of the comparative examples and (b) shows the emission spectra of the examples.

Figure 12A:
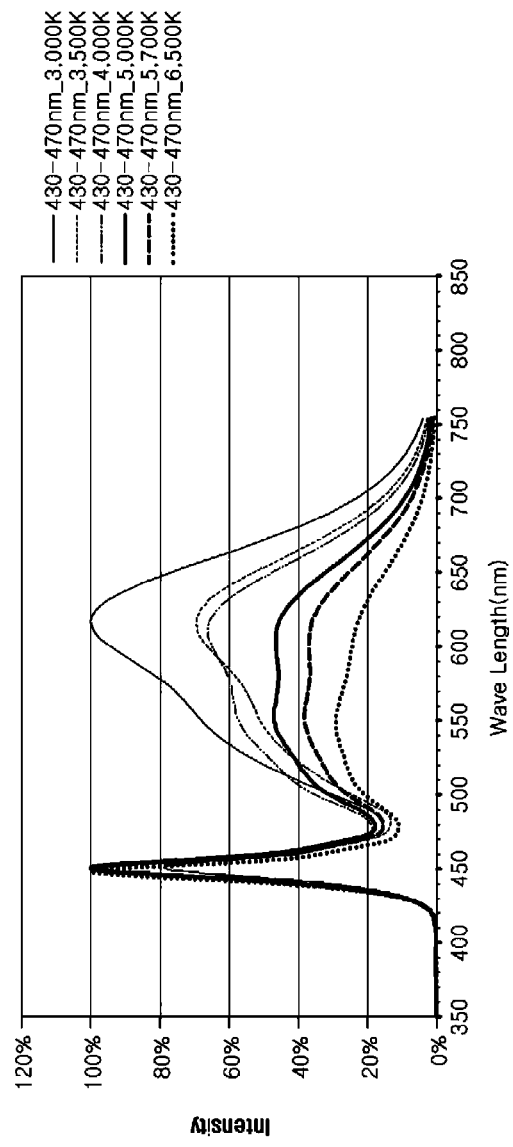
FIG. 12 illustrates the overall emission spectra of FIGS. 6 to 11.
Figure 12B:
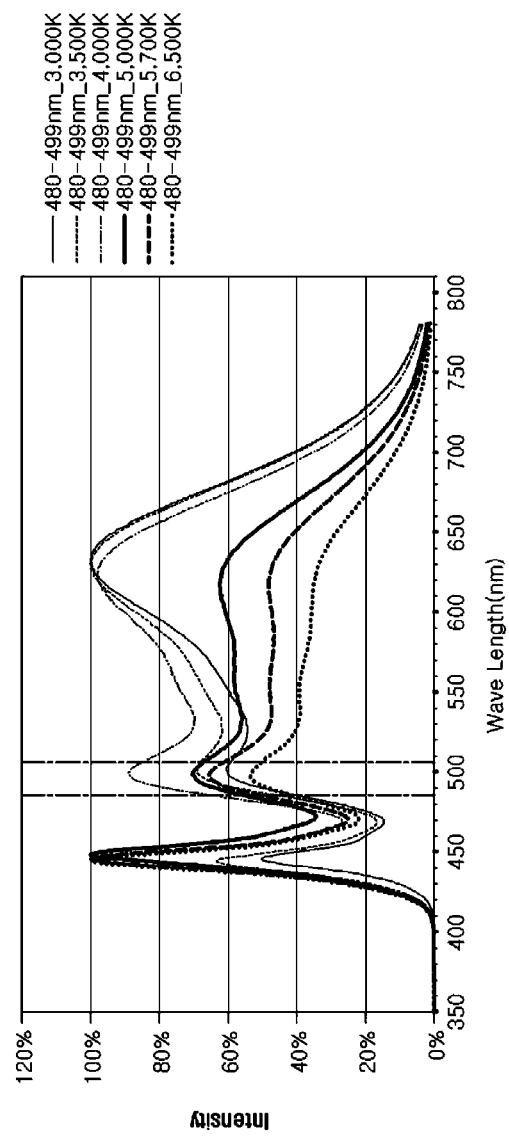

As illustrated in FIG. 12(b), the peak wavelength was formed in the range of 485~504 nm in the emission spectra of the examples according to the present invention, whereas there was no peak wavelength in the range of 485~504 nm in the emission spectra of the comparative examples as shown in FIG. 12(a).

As illustrated in FIG. 12(b), three or more peak wavelengths having different wavelength bands in the overall spectrum were formed in the examples according to the present invention, but there were two peak wavelengths having different wavelength bands in the overall spectrum in the comparative examples of FIG. 12(a).

Based on the emission spectrum results as above, the peak wavelengths in the range of 485~504 nm in the emission spectrum according to the present invention are formed, and thereby R12 may be increased to 90% or more. Furthermore, R9 may be greatly increased by virtue of the formation of the peak wavelengths in the range of 485~504 nm. Consequently, specific color rendering indices R9 to R15 may be uniformly improved.

Hence, when the phosphor including the first phosphor having a peak wavelength band of 480~499 nm is applied with the use of a blue LED chip having an excitation wavelength of 440~460 nm, the CRI may become uniform in the color temperature range from 3000K to 6500K. Especially, R9 and R12 may be drastically improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Thus, the embodiments of the present invention do not limit the spirit of the invention but are construed to explain it. Furthermore, it is to be understood that the scope of protection of the invention is set forth by the following claims, and all the technical ideas within the range equivalent thereto are incorporated into the scope of the invention.

What is claimed is:

1. A white light emitting device, comprising a blue LED chip having an excitation wavelength of 440~460 nm and a phosphor layer excited by the excitation wavelength of the blue LED chip to emit light which comprises mixtures of phosphor powder, wherein said phosphor layer consists of:

a first phosphor powder having an emission peak wavelength of 480~499 nm, including a fluorescent material represented by the Chemical Formula of $(Ba,Eu)Si_x(O,Cl)_xN_x$ (1<x<5);

a second phosphor powder having an emission peak wavelength of 500~560 nm, including at least one fluorescent material selected from a group of $(Sr,Ba,Ca)_xSiO_{2x}$:Eu (1<x<5), $Si_{6-y}Al_yO_yN_{8-y}$:Eu (0.1<y<0.5), and $Al_{8-z}Lu_zO_{12}$:Ce$^{++}$ (1<z<5); and a third phosphor powder having an emission peak wavelength of 600~650 nm, including at least one fluorescent material selected from a group of (Sr,Ca)AlSiNx:Eu (1<x<5), and CaAlSiNy:Eu (1<y<5), wherein the white light emitting device has an average color index of over 90% or more and a color rendering index R9 of 90% or more.

2. The white light emitting device of claim 1, wherein the white light emitting device has a peak wavelength in a range of 485~504 nm in an emission spectrum.

3. The white light emitting device of claim 1, wherein the white light emitting device has a color rendering index R12 of 90% or more.

* * * * *